United States Patent [19]

Kurisu et al.

[11] Patent Number: 5,237,443
[45] Date of Patent: Aug. 17, 1993

[54] FINE ADJUSTMENT TUNING APPARATUS FOR TV AND A METHOD OF STORING TUNING DATA

[75] Inventors: Motohiro Kurisu, Seoul; Sang S. Lee, Suweon; Soon D. Kim, Seoul, all of Rep. of Korea

[73] Assignee: SamSung Electronics Co., Ltd., Suwon, Rep. of Korea

[21] Appl. No.: 802,281

[22] Filed: Dec. 4, 1991

[30] Foreign Application Priority Data

Dec. 31, 1990 [FR] France ................. 90-22683

[51] Int. Cl.$^5$ ............................................. H04N 5/50
[52] U.S. Cl. .......................... 358/192.1; 358/193.1; 455/182.3
[58] Field of Search ............... 358/188, 193.1, 195.1, 358/192.1, 191.1; 455/182.2, 182.3, 183.2, 186.1, 265, 192.2, 192.3, 173.1, 180.2

[56] References Cited

U.S. PATENT DOCUMENTS

| | | | |
|---|---|---|---|
| 4,156,850 | 5/1979 | Beyers, Jr. ................. | 455/186.2 |
| 4,387,400 | 6/1983 | Borg ............................. | 455/180.2 |
| 4,410,913 | 10/1983 | Chin et al. ................... | 358/192.1 |
| 4,536,797 | 8/1985 | Maturo et al. ............... | 358/192.1 |
| 4,897,727 | 1/1990 | Richards ...................... | 455/151.1 |
| 5,034,819 | 7/1991 | Tsukagoshi ................... | 358/191.1 |
| 5,103,313 | 4/1992 | Chan et al. .................. | 358/192.1 |

FOREIGN PATENT DOCUMENTS 51779  4/1988  Japan .

Primary Examiner—James J. Groody
Assistant Examiner—Glenton B. Burgess
Attorney, Agent, or Firm—Robert E. Bushnell

[57] ABSTRACT

A fine adjustment tuning apparatus for televisions includes a key matrix part, a microcomputer part, a local osicillating part, and a red/green/blue mixer part. The method of storing the tuning data includes an initial mode setting step, an on screen display displaying step, a storing deciding step, an input time detecting step, and a key input routine implementing step. The present invention eliminates the need to fine tune each time a new channel is selected.

16 Claims, 8 Drawing Sheets

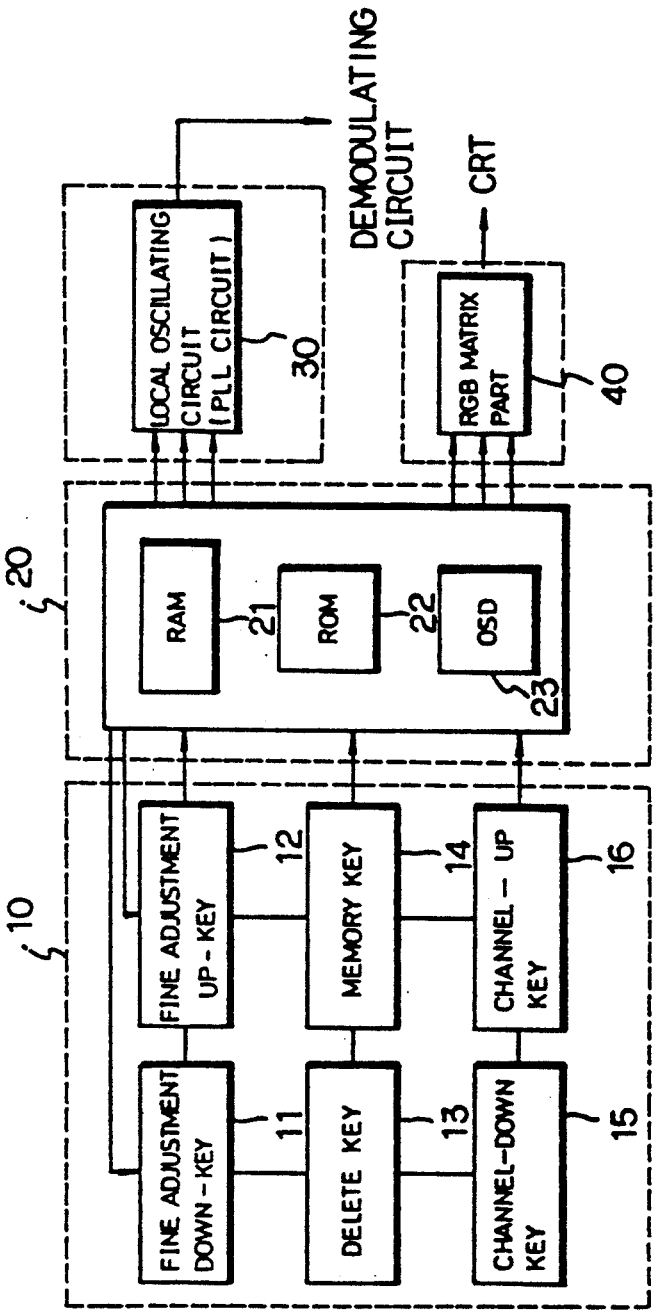

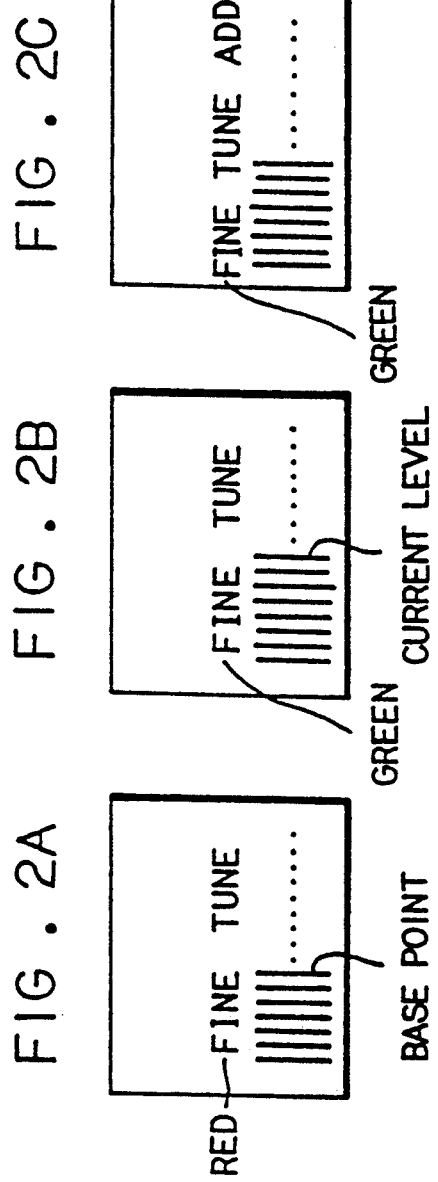

FIG. 3A

| CHANNEL 1 |
| FINE ADJUSTMENT DATA |
| CHANNEL 2 |
| FINE ADJUSTMENT DATA |
| . |
| . |
| . |
| . |
| . |
| CHANNEL 8 |
| FINE ADJUSTMENT DATA |

FIG. 3B

| o o h |
| o o h |
| o o h |
| o o h |
| . |
| . |
| . |
| o o h |
| o o h |

FIG. 3C

| 02 |
| 1 A h |
| o o h |
| o o h |
| . |
| . |
| . |
| o o h |
| o o h |

FIG. 3D

| 0 5 h |
| 3 0 h |
| 0 2 h |
| 1 A h |
| . |
| . |
| . |
| o o h |

FIG. 3E

| X X |
| . |
| . |
| . |
| . |
| X X |
| 0 5 h |
| 3 0 h |
| 0 2 h |
| 1 A h |

FIG. 3F

| 34 |
| 1 F h |
| . |
| . |
| . |
| 0 5 h |
| 3 0 h |

FIG. 3G

| 34 |
| 1 F h |
| X X |
| . |
| . |
| X X |
| o o h |
| o o h |

FINE ADJUSTMENT TUNING APPARATUS FOR TV AND A METHOD OF STORING TUNING DATA

FIELD OF THE INVENTION

The present invention relates to a fine adjustment tuning apparatus for a television and a method of storing tuning data, and more particularly to, a fine adjustment tuning apparatus and a method of storing tuning data for MFC (Multi-Frequency Code) type TV tuning systems, in which a plurality of channels can be stored into a memory and the tuning data can be displayed in the form of bars in OSD (on-screen display).

BACKGROUND OF THE INVENTION

The conventional types of a fine adjustment tuning apparatus for a PLL (phase locked loop) synthesizer tuner eliminate tuning discords from a TV receiver and utilize a fine tuning technique to provide the most suitable tuning conditions to each channel.

However, such a technique is limited to the TV in which the respective channel frequencies are stored into a memory by a microcomputer (hereinafter MICOM), and when selecting a broadcasting station, the stored data is read out to display the selected channel on the screen of the TV.

Therefore, in the case where a user carries out a fine adjustment after selecting a channel, if the user selects another channel again, he must fine tune again because the fine tuning data is not stored during the change of the channel. Further, the conventional tuning apparatus and method thereof can not support the high performance function of the TV receiver.

SUMMARY OF THE INVENTION

The present invention is intended to overcome the above described disadvantages of the conventional techniques. Therefore, it is an object of the present invention to provide a fine adjustment tuning apparatus and a method of storing tuning data for a TV, in which the fine adjusted tuning data for the respective channels is stored into a memory by utilizing a fine tuning, and then, the tuning data is displayed in the form of bars on OSD to automatically tune the fine adjusted channel frequency for channel selection.

In achieving the above object, the TV tuning apparatus for carrying out the fine adjustment by a PLL synthesizer tuner according to the present invention comprises an up/down key for a fine adjustment frequency, a key matrix part for generating key input data from the up/down key to store or delete channels, a MICOM part for controlling the whole system by control programs to carry out the storing or deleting of fine adjustment channels and displaying them in the form of the OSD according to the inputted fine adjustment data from the key matrix part, a local oscillating circuit for carrying out the fine tuning according to the inputted fine adjustment data under the control of the MICOM part, and a RGB (red, green, blue) matrix part for mixing the inputted signals to display the fine adjustment data of the MICOM part with colored letters and bar levels.

In order to achieve the above object, the method of storing the tuning data according to the present invention comprises an initial mode setting step of judging the presence of a fine display mode by summing up the fine adjustment data and the local oscillating frequency, an OSD displaying step of color-displaying the result of comparing the inputted channel data value with the stored data value after the initial mode setting step, a memory-deciding step for judging to store the fine adjusted channel data and for displaying the stored state after the OSD displaying step, an input time detecting step of deciding to turn off the fine adjustment mode and bar display by detecting the duration of the key inputting, after the store deciding step, and an implementing key input step of carrying out the fine adjustment of up/down, storing and deleting the key inputs of the fine adjustment data for the selected channel provided from the key matrix part after the input time detecting step.

BRIEF DESCRIPTION OF THE DRAWINGS

The above object and other advantages of the present invention will become more apparent by describing in detail the preferred embodiment of the present invention with reference to the attached drawings in which:

FIG. 1 is a block diagram showing the fine adjustment tuning apparatus for televisions according to the present invention;

FIGS. 2A, 2B, and 2C illustrate examples of fine adjustment displays on the TV screen;

FIGS. 3A, 3B, 3C, 3D, 3E, 3F, and 3G are tables showing the storing of channel fine adjustment data;

DETAILED DESCRIPTION OF THE PREFERRED EMBODIMENT

Figure 4:
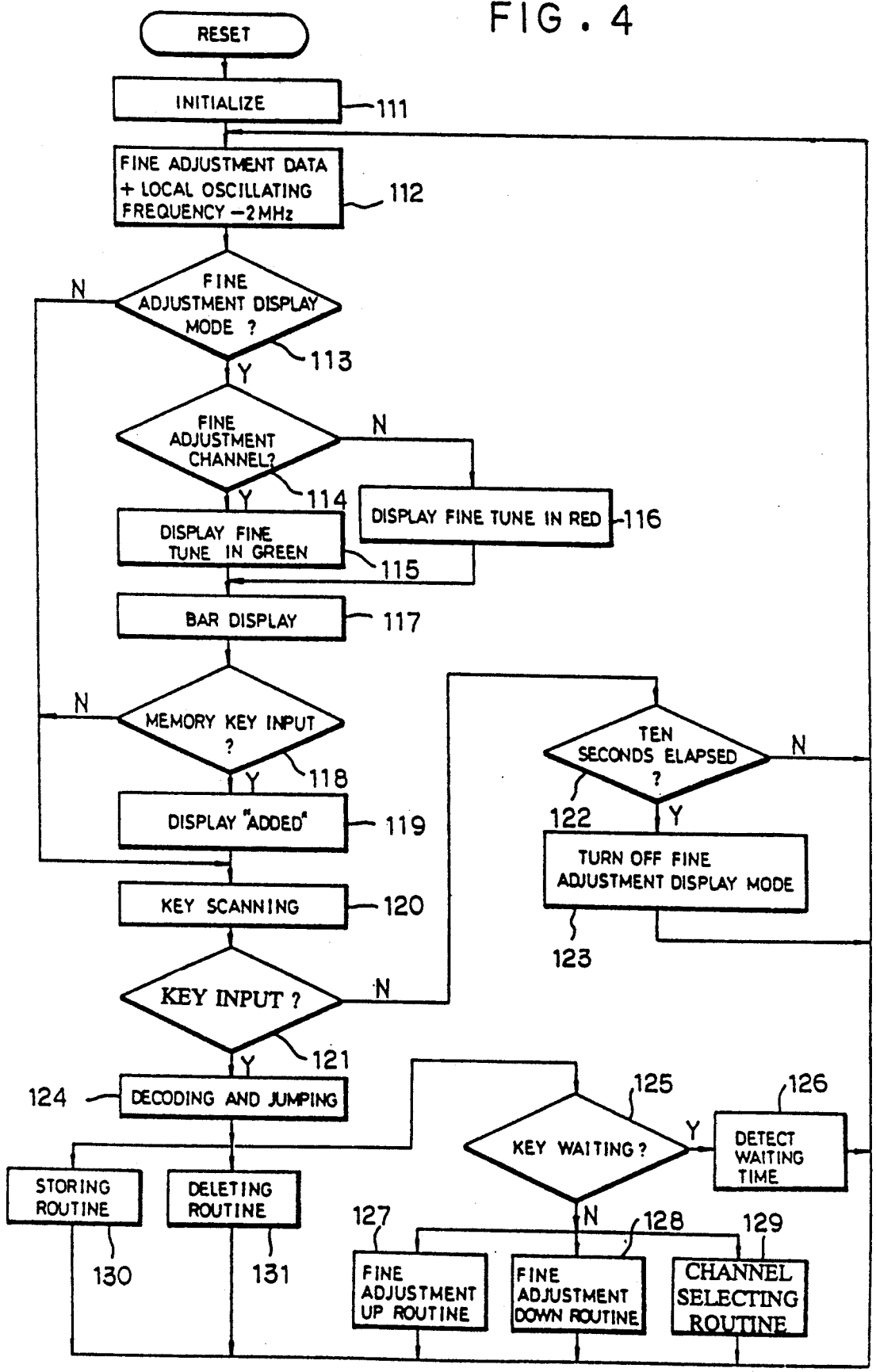
FIG. 4 is a flow chart showing the tuning data storing method according to the present invention.

FIG. 1 is a block diagram showing the tuning apparatus and its related television portions according to the present invention. In FIG. 1 a key matrix part 10 receives key inputs and supplies data to a MICOM part 20, to carry out the fine tuning up/down adjustment, deleting and storing of tuning data of the fine adjustment frequency and channel up/down selection. In the MICOM part 20, a RAM 21 stores the tuning data, and a ROM 22 operates various control programs. The MICOM part 20 controls the system through an OSD circuit 23, and displays the channel and the fine adjustments on a screen based on the selection of channels.

A local oscillating circuit (PLL circuit) 30 is driven under the control of the MICOM part 20, and, if RGB (Red, Green, and Blue) chrominance signals are outputted under the control of the OSD circuit 23 of the MICOM part 20, a RGB matrix part 40 mixes them and displays the tuning data in the form of OSD on a screen CRT (Cathode-Ray Tube).

The key matrix part 10 includes a fine adjustment down-key 11 for carrying out fine adjustments by stepping down frequency, a fine adjustment up-key 12 for carrying out the fine adjustments by stepping up the frequency, a storing key 14 for storing the fine-adjusted tuning data into a RAM, a deleting key 13 for deleting the fine-adjusted tuning data, and a channel-down key 15 and a channel-up key 16 for selecting the channels.

FIGS. 2A, 2B, and 2C are examples of the fine-adjusted tuning data displayed on the TV screen in the form of OSD, when bars show the up/down level of the frequency.

FIG. 2A shows the case where the fine-adjusted data is not stored. For example, if it is assumed that the stored state is displayed in green color and that the non-stored state is displayed in red color, the MICOM part 20 drives the internal OSD circuit 23 in such a manner that, if the fine adjusted data is stored, letters "FINE TUNE" are displayed in green color, and, if any data is not stored, letters "FINE TUNE" are displayed in red color. Further, when selecting the channel, the initial bars' mark is displayed based on the center portion of which frequency is equivalent to local oscillating frequency +2 MHz. The fine adjustment is achieved in the range of ±2 MHz from its maximum and minimum values to be displayed in the form of the bars.

FIG. 2A illustrates the display of such an initial state, and FIG. 2B illustrates the case where such fine-adjusted data is stored, in which the bars display the levels of the stored data. FIG. 2C illustrates the display for the case where the current fine-adjusted data is stored, in which the letters are displayed in the form of "FINE TUNE ADDED" in green color.

FIG. 3 illustrates the storing method for the fine-adjusted channel data. It is difficult to store all the channels in view of memory capacity, and, if all the channels are to be stored, a large capacity RAM has to be used. The use of such a RAM becomes a factor of increasing the manufacturing cost, and therefore, the relationship of storing the data by the usual RAM will be shown in tables.

FIG. 3A illustrates the fine channel adjustment data with reference to an example of 8 channels at the maximum. The number value of the last inputted channel is positioned at the top, followed by the fine-adjusted data values for the channel, while the fine-adjusted data for the first inputted channel is placed at the bottom of the table.

FIG. 3B illustrates a memory table for the case where the fine-adjusted data is not stored at the initial state. FIG. 3C illustrates the case where the fine-adjusted data for a channel 2 is stored at the initial state, in which the channel number is placed at the top of the table and the fine-adjusted data value is shown below, it as hexadecimal.

FIG. 3D illustrates the case where a second channel is stored, in which the positions of the inputted data values are pulled down by one level respectively, so the last inputted data value is placed at the top.

FIG. 3E illustrates the case where 6 channel fine-adjusted data is inputted after the step of FIG. 3D, in which the data value of the channel 2 is inputted first and placed at the bottom of the table.

FIG. 3F illustrates the case where still another channel is inputted after all the fine adjusted data values are inputted to the memory for the respective channels. The data value for the first stored channel 2 is automatically deleted, and the fine adjusted data value for the currently inputted channel 34 and the fine-adjusted data value for the second inputted channel appear on the table.

FIG. 3G illustrates the data values of the table for the case where the channel 5 is deleted by a front key of a television or a remote control key in the key matrix part 10 shown in FIG. 1, in which the user has arbitrarily selected the channel and deleted the fine adjusted data.

The present invention as above will now be described as to its operations and effects referring to the flow chart. First, as shown in FIG. 4, the overall operation will be explained.

The overall operation of the apparatus according to the present invention comprises an initial mode setting step of discriminating the fine adjustment display mode after setting an initial value, adding a local oscillating frequency to the fine-adjusted data, and subtracting 2 MHz therefrom, an OSD displaying step of deciding the display state of the OSD by comparing the channel input data with the data values of the memory under a fine adjustment display mode, a storing deciding step of judging to store and display the fine adjusted data value and after detecting the existence or absence of data, a key input detecting step of deciding to turn off the fine adjustment mode and the bar display condition by detecting the fine-adjusted key input and its duration, and a key routine implementing step of carrying out fine adjustment up/down, and storing and deleting for the channel selection after carrying out the key input detecting step.

The initial mode setting step includes a step 111 of initializing from the local oscillating frequency after resetting, a sub-step 112 of subtracting 2 MHz after summing up the fine adjusted data, and a sub-step 113 of discriminating whether the fine adjustment displaying mode is selected.

The OSD displaying step includes a sub-step 114 of discriminating the existence or absence of a fine-adjusting channel in the fine adjustment display mode at the initial mode setting step, a sub-step 115 of displaying the fine tuning in the green form of OSD in the existence of stored channel, a sub-step 116 of displaying the fine tuning in the red form of OSD in the absence of channel stored at the sub-step 114, and a sub-step 117 of displaying the fine adjustment data with bars after carrying out the sub-steps 115, 116.

The storing deciding step includes a sub-step 118 of discriminating either the existence or the absence of the storing key input after the sub-step 117, and a sub-step 119 of displaying "ADDED" in the OSD in the existence of the storing key input.

The key input deciding step includes a sub-step 120 of performing a normal key scan in the normal routine after the sub-step 119, a sub-step 121 of discriminating either the existence or the absence of key input from the key matrix after the sub-step 120, a sub-step 122 of checking the elapse of ten seconds in the existence of key input, and a sub-step 123 of turning off the fine adjustment display mode after ten seconds.

The key routine implementing step includes a sub-step 124 of jumping over to a relevant routine after decoding the relevant data address in the existence of the key input at the key input discriminating sub-step 121, a sub-step 125 of discriminating a continuous pressing of a key, a sub-step 126 of detecting the waiting time during the key input waiting state after the key input at the sub-step 125, sub-steps 127, 128 of carrying out fine adjustment up/down routines after the sub-step 125, a sub-step 129 of carrying out a channel selecting routine, and sub-steps 130, 131 of storing or deleting fine adjusted data to/from memory.

As described above, the MICOM part 20 carries out the initialization (sub-step 111), adds the local oscillating frequency to the fine adjusted data, and subtracts 2 MHz therefrom (sub-step 112). In the bar display of the fine adjusted data, an initial bar display reference value (center value) is set to value higher by 2 MHz than that of the local oscillating frequency, and therefore, the frequency range of the fine adjustment usually comes within ±2 MHz.

Thereafter, the MICOM part 20 discriminates whether it is under a fine adjustment mode or not (sub-step 113), and, if it is not in the fine adjustment mode, a general key scanning is carried out in the TV main routine (sub-step 120). Contrarily, if it is the fine adjustment mode, a discrimination is made whether the data of the initially selected channel is stored in the RAM 21 (sub-step 114). If it is not stored, a fine tuning display, i.e., the letters "FINE TUNE" are displayed in red color (sub-step 116), while, if it has already been stored in the RAM 21, the letters "FINE TUNE" are displayed in green colors (sub-step 115).

Thereafter, the fine adjusted data is displayed in the OSD (sub-step 117).

Thereafter, the discrimination is made whether the storing key is inputted (sub-step 118), and, if there is the storing key input, the letter "ADDED" is added on the OSD (sub-step 119) before carrying out the key scanning (sub-step 120). If there is no key inputting at the sub-step 118, the sub-step 120 is carried out. Thereafter, it is discriminated whether there is any key input from the key matrix part 10 such as fine adjustment up/down, channel selection, storage, deletion and the like (sub-step 121). In case where there is a key inputting, it is discriminated whether ten seconds have elapsed. Then the OSD display is made for ten seconds, (sub-step 122), and the fine adjustment display mode is turned off upon elapsing of ten seconds (sub-step 123). After the sub-step 123 or during the sub-step 122 if ten seconds have not elapsed, then the operation is returned to the sub-step 112 to repeat the above described sub-steps.

On the other hand, in the case where there is a key inputting at the sub-step 121, the address of the inputted key is decoded and the operation is jumped to the relevant routine (sub-step 124). Then, the relevant routine among the fine adjustment up/down, the channel selection, the data storing or deletion and the like is carried out according to the input from the key matrix part 10 (sub-steps 127 ... 131). If the inputted key is a storing key 14 or a deletion key 13, their relevant routines are respectively carried out (sub-steps 130, 131). If the inputted key is related to the up/down such as the fine adjustment up-key 12, the fine adjustment down-key 11, the channel up-key 16, or the channel down-key 15, then the existence or absence of a key waiting is discriminated so as to discriminate the continuation of the key input. Then, if the key is waiting, the waiting time is detected (sub-step 126) and the sub-step 112 is carried out again.

Contrarily, if the key is not waiting at the sub-step 125, the fine adjustment up/down routine (sub-steps 127, 128) or a channel selection routine (sub-step 129) which is inputted in key processing routines is carried out at the sub-step 121.

Under this condition, if the fine adjustment up/down keys 11, 12 of the key matrix part 10 are turned-on, the MICOM part 20 discriminates the existence or absence of a fine adjustment on-state to carry out the fine adjustment up/down routine.

Figure 5:
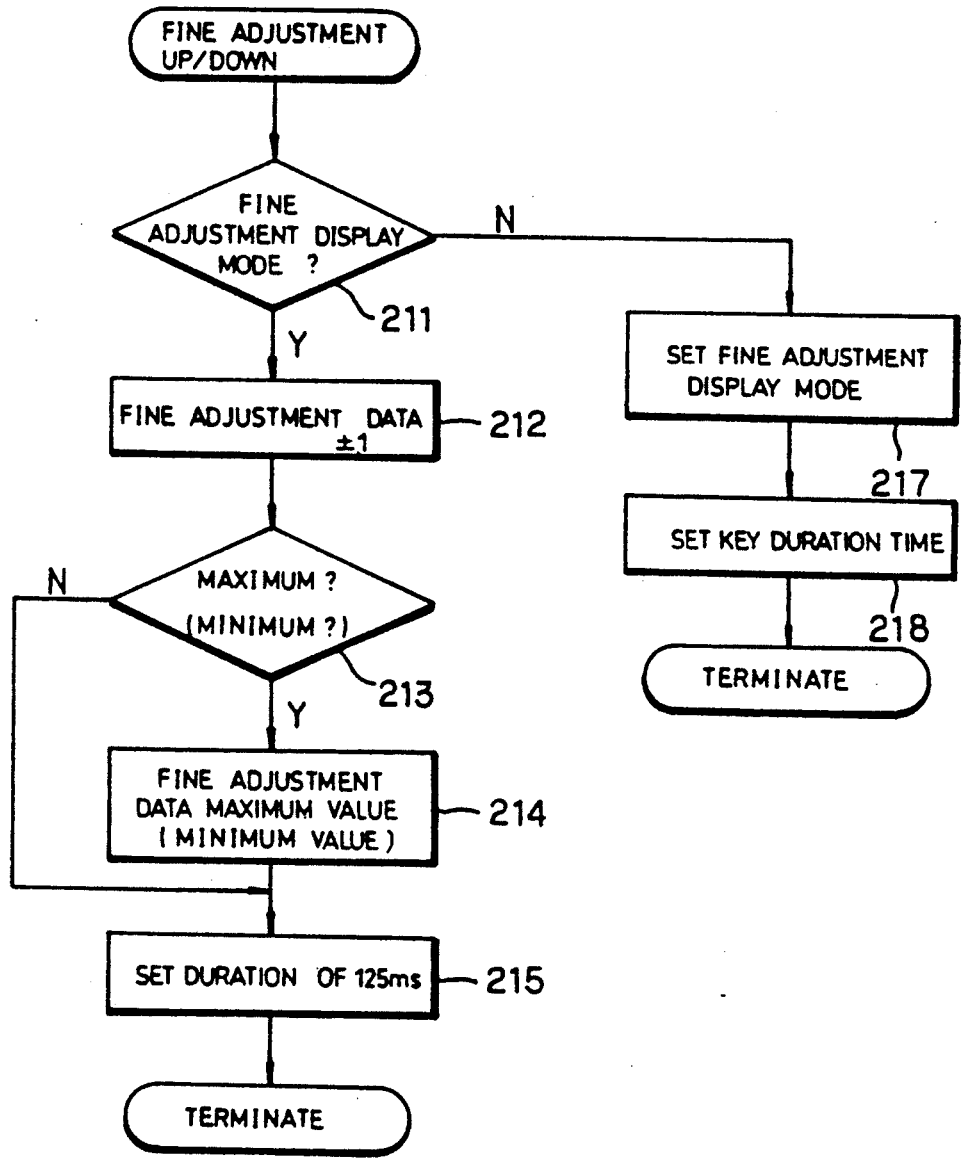
FIG. 5 illustrates the fine adjustment up/down step of the tuning data storing method shown in FIG. 4.

As shown in FIG. 5, the fine adjustment routine performs to discriminate as to the fine adjustment display mode (sub-step 211). If it is the fine adjustment display mode, the fine adjustment data is adjusted by one step (e.g., 62.5 KHz)+1 for the fine adjustment up or −1 for the fine ajustment down (sub-step 212). When performing the fine adjustment-up after the sub-step 212, the discrimination is made whether the bars in the OSD are at the maximum, while, when performing a fine adjustment-down, the discrimination is made whether the bars are at the minimum (sub-step 213) so as to discriminate the fine adjustment range from the maximum +2 MHz to the minimum −2 MHz around a reference point.

If the maximum or the minimum is discrimination at the sub-step 213, the minimum value or the maximum value is applied to the fine adjustment data (sub-step 214). That is, in the case where the fine adjustment-up is performed continuously at the maximum value, the bar display starts from the minimum value −2 MHz, while, in the case where a fine adjustment-down is carried out continuously at the minimum value, the bar display starts from the maximum value +2 MHz. Thereafter, a setting is made for the duration of 125 ms (sub-step 215), and then the routine is terminated. Meanwhile, if the bar display is at the maximum at the sub-step 213, a setting is made for the duration of 125 ms (sub-step 215), and then the routine is terminated. At the sub-step 215, the bar display is subjected to up or down in the unit of 125 ms during the up/down inputting.

On the other hand, if the fine adjustment display mode is not in the turn-on state at the sub-step 211, the fine adjustment display mode is set (sub-step 217). Then the time is set for the duration of the key for 250 ms (sub-step 218), and then the routine is terminated so that the up or down is automatically carried out after elapsing of 250 ms from the inputting of the fine adjustment up or down key.

The fine adjustment up/down routine is set in such a manner that, when key presetting in the fine adjustment up or down key, the level of the current fine adjustment data is displayed for 250 ms with the bars and every time the key is inputted, the bar display is continued for 150 ms, thereby implementing the up or down.

The bar display of the fine adjustment data comprises 32 steps equivalent to 2 MHz from the minimum value to the reference point, with 64 steps to the maximum value.

Figure 6:
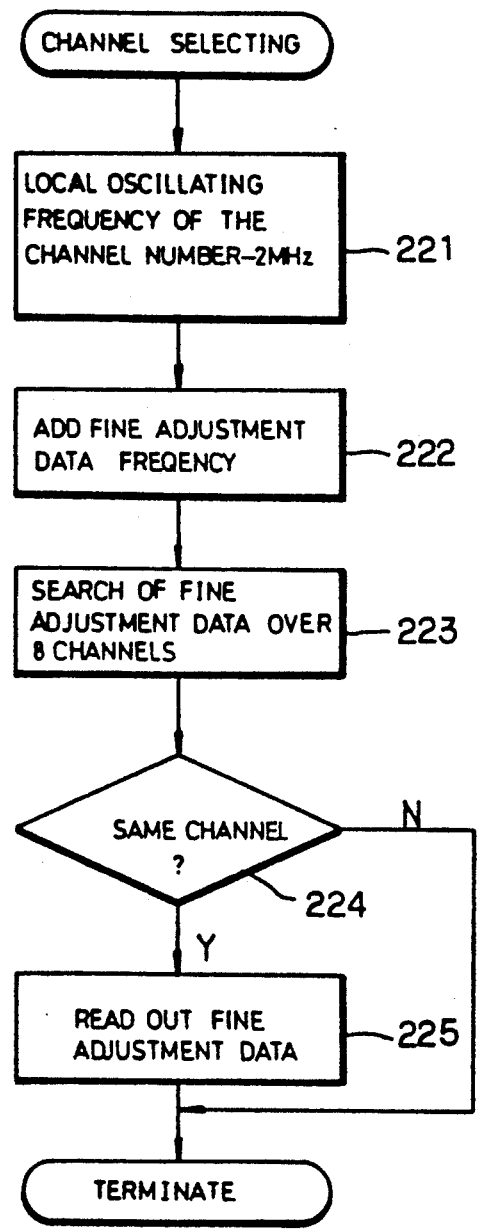
FIG. 6 illustrates the channel selecting step of the tuning data storing method shown in FIG. 4.

Meanwhile, the channel selecting routine is constituted of a flow chart as shown in FIG. 6. First, 2 MHz is subtracted from the local oscillating frequency of the current channel number (sub-step 221) to calculate the minimum frequency for fine tuning represented by the bar display, where the center, i.e., reference, point of the bar display corresponds to the local oscillating frequency and the maximum frequency of the bar display is the local oscillating frequency +2 MHz. Thereafter, the fine adjustment data is adjusted within ±2 MHz of the reference point (sub-step 222). That is, the value of the fine adjustment data is added or subtracted to the local oscillating frequency of the selected channel to carry out the fine adjustment for the selected channel.

Thereafter, the currently selected channel is checked with the corresponding fine adjusted data for 8 channels (for example) as stored in the RAM 21 of the MICOM part 20 (sub-step 223), and a discrimination is made whether the same channel is recorded in the RAM 21 (sub-step 224). If there is the same channel, the fine adjustment data is read out from the memory (sub-step 225), and then the routine is terminated. If there is no same channel, the routine is immediately terminated.

Figure 7:
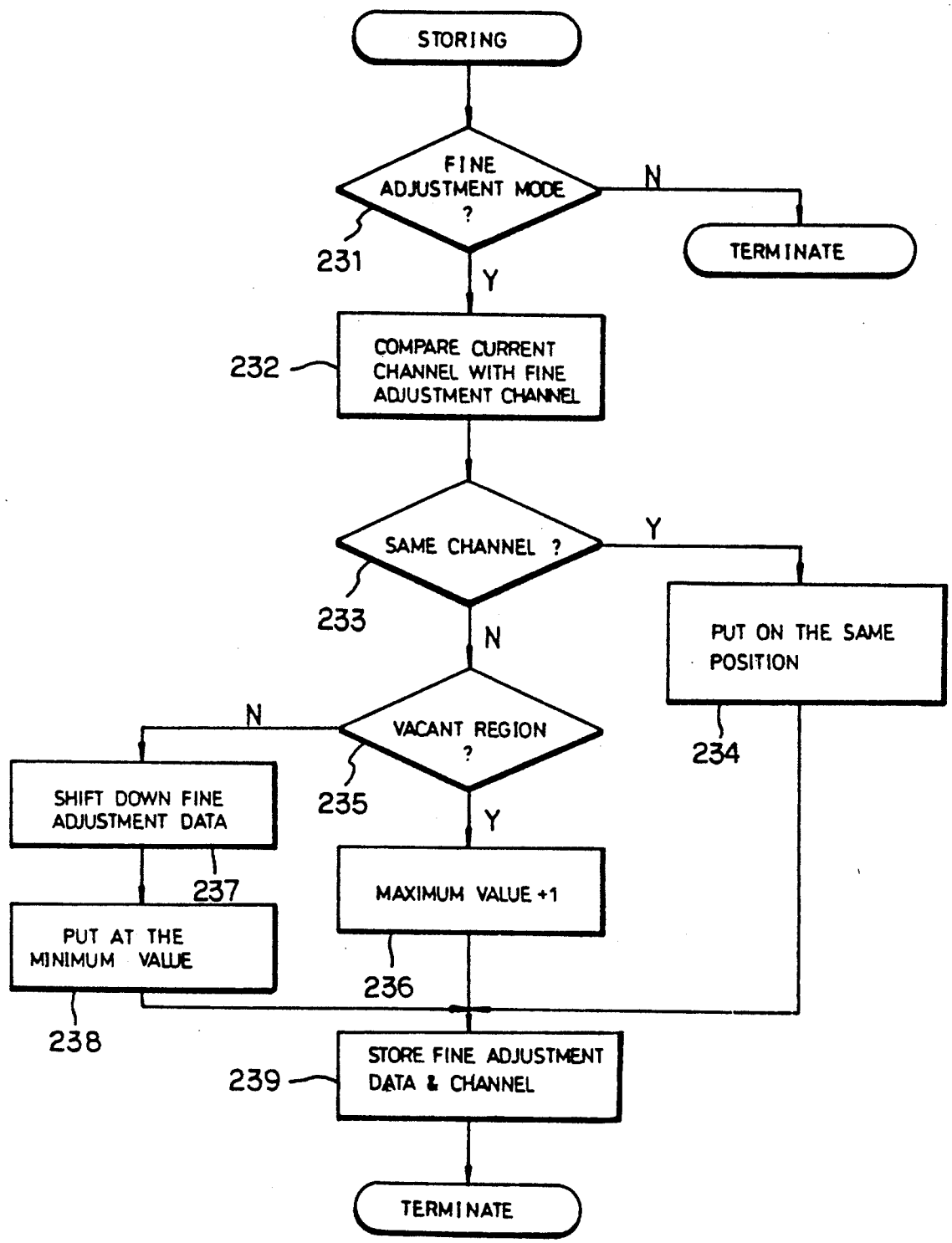
FIG. 7 illustrates the fine adjustment data storing step of the tuning data storing method.

Meanwhile, as shown in FIG. 7, the fine adjustment data storing routine is constituted such that the MICOM part 20 is put to a storing mode while inputting the storing key, and a discrimination is made whether it is the fine adjustment display mode (sub-step 231). If it is not the fine adjustment display mode, the routine is terminated, so that no storing should be made. If it is the fine adjustment display mode, the current channel and the fine adjustment channel are compared with each other (sub-step 232), and a discrimination is made whether the two channels are the same ones (sub-step 233). If the two channels are the same ones, the fine adjustment data and the current channel are stored into the same memory position (sub-step 234).

On the other hand, if the current channel and the fine adjustment channel are not proven to be the same at the sub-step 233, a discrimination is made whether there is a vacant region in the memory or not (sub-step 235). If there is the vacant region, maximum value +1 is stored into the storing region (sub-step 236). That is, at the sub-step 236, all the channels stored in the memory are positionally moved, that is, all the data on the table is shifted by one on the whole, so that the data for the fine adjustment channel can be inputted to the top of the table.

On the other hand, if there is no vacant region for storing new data in the memory at the sub-step 235, the fine adjustment channels and the stored data are shifted down by one in Table 3, so that the initially inputted channels and data should be automatically erased (sub-step 237).

Thereafter, the fine adjustment channel and the data are placed at the top of the table, i.e., the minimum value of the memory position (sub-step 238). After carrying out the sub-steps 234, 236 and 238, the fine adjustment channels and the data are stored, and then the routine is terminated (sub-step 239).

Figure 8:
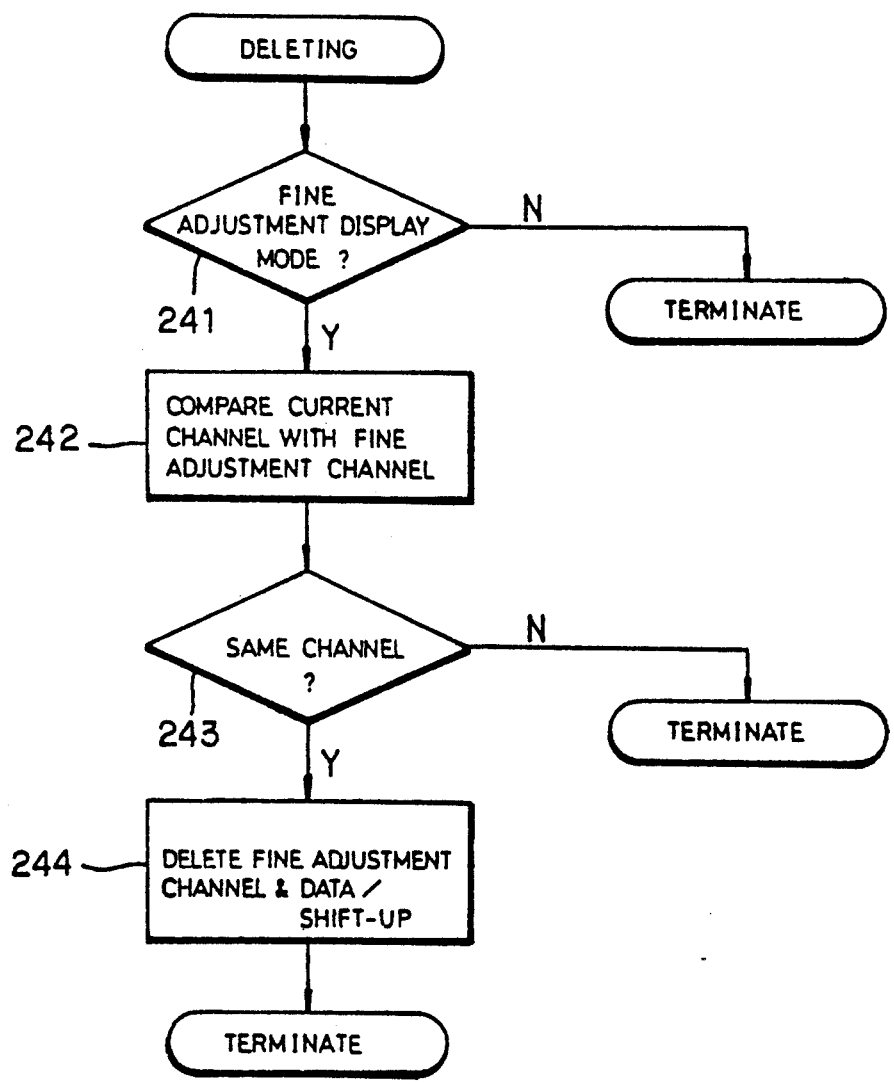
FIG. 8 illustrates the fine adjustment data deleting routine shown in FIG. 4.

Meanwhile, the fine adjustment data deleting routine is carried out in such a manner as shown in FIG. 8.

That is, if a deleting mode is brought out by inputting a deleting key, first a discrimination is made whether it is the fine adjustment display mode or not (sub-step 241). If it is not the fine adjustment display mode, the deleting routine is not carried out, and the routine is terminated.

On the other hand, if it is the fine adjustment display mode, the current channel and the fine adjustment channel are compared with each other (sub-step 242), and a discrimination is made whether the two values are equal to each other according to the comparison (sub-step 243). If the current channel and the fine adjustment channel are different from each other, the routine is terminated (sub-step 244).

That is, if the two values are equal to each other according to the comparison, the fine adjustment channel and the data are deleted and all the data is shifted up by one (sub-step 244).

Thus, when a stored channel is arbitrarily deleted the data stored prior to the deleted channel data is shifted up on the table.

The MICOM part 20 is provided with programs for performing the above described operations in the above sequence, and the OSD circuit 23 is driven by the key inputting from the key matrix part 10, and the RGB mixer part 40 mixes the signals, before displaying the data on the OSD on the television screen.

The channel data which has undergone the fine adjustment up/down are 3-terminal serial signals and inputted into the local oscillating circuit 30 in the form of the local oscillating frequency data, so that the fine adjustments should be done on the local oscillating frequency to carry out the fine tuning.

Such fine channel adjustments provide the fine adjustment tuning data to change the frequency division ratio of the PLL circuit of the local oscillating circuit 30. That is, if the fine adjustment up/down keys 11, 12 of the key matrix part 10 are pressed, "FINE TUNE" and the current level are displayed on the screen in the form of the OSD. Under this condition, if the storing key 14 is pressed, the inputted data is stored into the RAM 21 of the MICOM part 20. If it is found that the fine adjustment frequency for the channel is stored into the memory as a result of checking the storing region as above described storing routine, new data is stored in the storing region. Further, even if the channel is not stored, a memory replacement is carried out, and the new data is stored.

On the other hand, if there is no vacant region in the memory, the most initially inputted channel and its data are deleted from the storing region to input the new channel and its fine adjustment data.

The fine adjustment data is stored into the memory to a new fine adjusted channel as described above. Further, when deleting data, the deleting key is pressed while the fine adjustment data is displayed with bars in the OSD, and therefore, the channel and the fine adjustment data are deleted from the storing region to replace the data.

Further, in the case where fine adjustment data is stored into the memory, the green letter display is carried out when selecting the channel. On the other hand, when selecting the channel in the case where the fine adjustment data is not stored, the red letter display is made, so as to indicate the existence or absence of the stored fine adjustment data.

As described above, the fine adjustment tuning apparatus for the televisions according to the present invention comprises a key matrix part for generating key input data such as a fine adjustment frequency up/down, and channel up/down, storing and deleting of fine adjustment data, a MICOM part for controlling the whole system by the control programs executing the storing and deleting of the fine adjustment channels and their data and displaying them in the form of the OSD, after receipt of the fine adjustment data from the key matrix part, and a local oscillating circuit for carrying out fine tuning by performing local oscillations after receipt of the fine adjustment data under the control of the MICOM part.

When the tuning of the channel key is not accurately carried out, the fine adjustment is carried out in order to store its data. Further, this fine adjustment data for a plurality of channels is stored into the memory, so that, whenever the channel is selected, the stored fine adjustment data is displayed in the form of the OSD to carry out the fine adjustment automatically, so that the trouble of carrying out the manual fine adjustment at every new selection of channel is overcome.

What is claimed is:

1. A fine tuning apparatus for a phase-locked-loop synthesizer tuner of a television, said apparatus comprising:

key matrix means for operator interface with the fine tuning apparatus, said key matrix means comprising a deleting key, a storing key, channel up/down keys, and fine tuning up/down keys;

a microcomputer controlling the fine tuning apparatus by using control programs for displaying fine tuning data corresponding to a variation of a local oscillating frequency of a selected channel on an on-screen-display comprising a bar level and alphanumeric characters, and storing said selected channel and said corresponding fine tuning data into first and second registers, respectively, of a memory table of a memory, and deleting said fine tuning data in the memory in dependence upon said operator interface of the key matrix means;

local oscillating means for providing the local oscillation frequency of the selected channel; and red-green-blue mixer means for coloring the on-screen-display in dependence upon the fine tuning data being stored or not stored in said memory.

2. The fine tuning apparatus as claimed in claim 1, wherein said key matrix means comprises:

said fine adjustment up/down keys for adjusting said local oscillating frequency up/down by stepping up/down said fine tuning data when pressed;

said storing key for storing said fine tuning data and said corresponding selected channel number into said memory when pressed;

said deleting key for deleting said stored fine tuning data and said corresponding stored channel number from said memory when pressed; and said channel up/down keys for providing said selected channel when pressed.

3. The fine tuning apparatus as claimed in claim 2, wherein said microcomputer comprises:

said memory being a random access memory for storing said fine tuning data and said corresponding selected channel number in response to said storing key being pressed;

a read-only-memory for storing said control programs; and an on-screen-display circuit for providing said on-screen-display by displaying said fine tuning data on a cathode-ray tube of the television.

4. A method of storing a fine tuning data for a television, comprising the steps of:

initializing by providing a local oscillating frequency corresponding to a selected channel and determining if a fine tuning displaying mode is selected;

if the fine tuning displaying mode is selected, displaying a color on-screen-display on a cathode-ray tube of the television and adjusting the fine tuning data being one of fine tuning data stored in a memory with a corresponding channel and fine tuning data not stored;

storing said selected channel and said corresponding fine tuning data into first and second registers, respectively, of a memory table of said memory in response to activation of a memory key of a key matrix having a plurality of keys;

input time detecting for turning off said fine tuning displaying mode and said on-screen-display when none of the plurality of keys is activated within a given duration of time; and implementing routines in response to activation of said plurality of keys, said routines comprising a fine tuning up routine, a fine tuning down routine, a channel selecting routine, a storing routine, and a deletion routine.

5. The method of claim 4, wherein said initializing step comprises the sub-steps of:

initializing after resetting;

determining an actual tuning frequency of the stored selected channel by summing said stored fine tuning data corresponding to the selected channel and said local oscillating frequency; and judging whether said fine tuning displaying mode is selected.

6. The method of claim 4, wherein said displaying step comprises the sub-steps of:

determining whether said fine tuning data and said corresponding channel are stored in said memory; and displaying said on-screen-display as alphanumeric characters and a bar, said alphanumeric characters having a first color when said fine tuning data is stored and second color when said fine tuning data is not stored.

7. The method of claim 4, wherein said storing step comprises the sub-steps of:

determining whether said memory key is activated; and indicating via the on-screen-display that the selected channel and the corresponding fine tuning data is being stored in response to activation of the memory key.

8. The method of claim 4, wherein said input time detecting step comprises the sub-steps of:

determining whether one of the plurality of keys is activated by key-scanning said plurality of keys; and detecting said predetermined duration of time and turning off said fine tuning displaying mode and returning to said initializing step when none of the plurality of keys is activated during said predetermined duration of time.

9. The method of claim 4, wherein said implementing step comprises the sub-steps of:

decoding an address of an activated key of the plurality of keys; and implementing one of said routines corresponding to an activated key, if said fine tuning displaying mode is not turned off in the input time detecting step.

10. The method of claim 9, wherein said fine tuning up routine comprises the sub-steps of:

(a) activating a fine tuning up key of said plurality of keys;

(b) setting the fine tuning display mode if said fine tuning display mode is not set and terminating the fine tuning up routine after a predetermined delay time;

(c) stepping up said fine tuning data by one step in response to said activation of the fine tuning up key when the fine tuning display mode is set;

(d) judging whether said fine tuning data is a maximum value; and (e) displaying said fine tuning data corresponding to a bar level of the on-screen-display.

11. The method of claim 9, wherein said channel selecting routine comprises the sub-steps of:

activating one of a channel up key and a channel down key of the plurality of keys to provide the selected channel;

determining a frequency of the selected channel corresponding to said local oscillating frequency;

determining whether said selected channel is stored with said corresponding fine tuning data in the memory; and reading the corresponding stored fine tuning data from the memory table.

12. The method of claim 9, wherein said storing routine comprises the sub-steps of:
   determining whether said fine tuning display mode is set when said memory key is activated, and terminating the storing routine when said fine tuning display mode is not set;
   determining whether said selected channel and said corresponding fine tuning data is stored at a first location of a memory table in memory;
   storing said selected channel and said corresponding fine tuning data into said first location in said memory if said selected channel and said corresponding fine tuning data is stored at the first location in said memory;
   if said selected channel and said corresponding fine tuning data is not stored in said memory, shifting down data in the memory table and storing said selected channel and said corresponding fine tuning data in a top two registers of the memory table.

13. The method of claim 9, wherein said deletion routine comprises the sub-steps of:
   determining whether a deletion key of the plurality of keys is activated;
   determining whether the fine tuning display mode is set, and terminating the deletion routine if the fine tuning display mode is not set;
   determining whether the selected channel corresponds to a channel being broadcast on the television;
   if the selected channel corresponds to the channel being broadcast on the television, deleting said selected channel and said corresponding fine tuning data from said memory and shifting up the data of the memory table located below the deleted channel and said corresponding fine tubing data.

14. The method of claim 9, wherein said fine tuning down routine comprises the sub-steps of:
   (a) activating a fine tuning down key of said plurality of keys;
   (b) setting the fine tuning display mode if said fine tuning display mode is not set and terminating the fine tuning down routine after a predetermined delay time;
   (c) stepping down said fine tuning data by one step in response to said activation of the fine tuning down key when the fine tuning display mode is set;
   (d) judging whether said fine adjustment tuning data is a minimum value; and
   (e) displaying said fine tuning data corresponding to a bar level on the on-screen-display.

15. A method of storing fine tuning data, comprising the steps of:
   selecting a channel for fine tuning using a channel select key of a key matrix having a plurality of keys;
   providing a predetermined local oscillating frequency corresponding to the selected channel;
   activating a fine tuning display mode by activating one of a fine tuning up key and a fine tuning down key of said plurality of keys and displaying an on-screen-display comprising alphanumeric characters and a bar level representing the fine tuning data of the selected channel, said alphanumeric characters having a first color if the fine tuning data is not stored in a memory and a second color if the fine tuning data is stored in the memory;
   terminating the fine tuning display mode if none of said plurality of keys is activated within a given duration of time;
   adjusting said fine tuning data by activating one of the fine tuning up key and the fine tuning down key to step up/down the fine tuning data, adjusting the local oscillating frequency corresponding to the fine tuning data of the selected channel, and displaying said adjusted fine tuning data corresponding to the bar level of the on-screen-display;
   storing said selected channel and said corresponding fine tuning data into a first and second register, respectively, of a memory table of said memory and indicating said storage on the on-screen-display in response to activation of a memory key of the plurality of keys, and shifting down previously stored data of the first and second registers to third and fourth registers of the memory table, respectively; and
   deleting said selected channel and said corresponding fine tuning data from memory in response to activation of a deletion key of the plurality of keys, and shifting up said previously stored data located below the deleted data in the memory table.

16. An apparatus for storing fine tuning data, comprising:
   means for selecting a channel for fine tuning in response to activation of a channel select key of a key matrix having a plurality of keys;
   means for providing a predetermined local oscillating frequency corresponding to the selected channel;
   means for activating a fine tuning display mode by activating one of a fine tuning up key and a fine tuning down key of said plurality of keys and by displaying an on-screen-display comprising alphanumeric characters and a bar level representing the fine tuning data of the selected channel, said alphanumeric characters having a first color if the fine tuning data is not stored in a memory and a second color if the fine tuning data is stored in the memory;
   means for terminating the fine tuning display mode if none of said plurality of keys is activated within a given duration of time;
   means for adjusting said fine tuning data by activating one of the fine tuning up key and the fine tuning down key to step up/down the fine tuning data, for adjusting the local oscillating frequency corresponding to the fine tuning data of the selected channel, and for displaying said adjusted fine tuning data corresponding to the bar level of the on-screen-display;
   means for storing said selected channel and said corresponding fine tuning data into a first and second register, respectively, of a memory table of said memory and indicating said storage on the on-screen-display in response to activation of a memory key of the plurality of keys, and for shifting down previously stored data of the first and second registers to third and fourth registers of the memory table, respectively; and
   means for deleting said selected channel and said corresponding fine tuning data from memory in response to activation of a deletion key of the plurality of keys, and shifting up said previously stored data located below the deleted data in the memory table.

* * * * *

UNITED STATES PATENT AND TRADEMARK OFFICE
CERTIFICATE OF CORRECTION

PATENT NO. : 5,237,443
DATED : August 17, 1993
INVENTOR(S) : Motohiro Kurisu, et al.

It is certified that error appears in the above-indentified patent and that said Letters Patent is hereby corrected as shown below:

Column 2, Line 45, Change "adjustment" to --adjustments-- ;

Column 11, Line 36, Change "tubing" to --tuning-- .

Signed and Sealed this

First Day of November, 1994

Attest:

BRUCE LEHMAN

Attesting Officer

Commissioner of Patents and Trademarks